US005482875A

United States Patent [19]
Vaitkus et al.

[11] Patent Number: 5,482,875
[45] Date of Patent: Jan. 9, 1996

[54] METHOD FOR FORMING A LINEAR HETEROJUNCTION FIELD EFFECT TRANSISTOR

[75] Inventors: Rimantas L. Vaitkus, Paradise Valley; Saied N. Tehrani, Scottsdale; Vijay K. Nair, Mesa; Herbert Goronkin, Tempe, all of Ariz.

[73] Assignee: Motorola, Inc., Schaumburg, Ill.

[21] Appl. No.: 229,266

[22] Filed: Apr. 18, 1994

Related U.S. Application Data

[62] Division of Ser. No. 932,526, Aug. 20, 1992, Pat. No. 5,304,825.

[51] Int. Cl.⁶ .................................................. H01L 21/335
[52] U.S. Cl. .......................... 437/40; 437/44; 437/133; 437/912; 148/DIG. 72
[58] Field of Search ............................ 437/40, 44, 126, 437/133, 912; 148/DIG. 72

[56] References Cited

U.S. PATENT DOCUMENTS 5,141,879  8/1992  Goronkin et al. .................. 437/40
5,180,681  1/1993  Mishra et al. ...................... 437/44

FOREIGN PATENT DOCUMENTS 0071645  3/1991  Japan .................................. 437/912
0110854  5/1991  Japan .................................. 437/912

Primary Examiner—Tuan H. Nguyen
Attorney, Agent, or Firm—Rennie William Dover

[57]  ABSTRACT

A low power heterojunction field effect transistor (10, 30, 50, 60) capable of operating at low drain currents while having a low intermodulation distortion. A channel restriction region (9, 38, 51) is formed between the gate electrodes (24, 41, 69) and the drain electrodes (25, 46, 65). The channel restriction region (9, 38, 51) depletes the channel layer (13, 33) thereby constricting a channel and lowering a drain saturation current. The channel restriction region (9, 38, 51) may be used to set a desired drain saturation current such that a second derivative of the transconductance with respect to the gate-source voltage is approximately zero and a first derivative of the transconductance with respect to the gate-source voltage is, approximately, a relative maximum at the desired operating point.

19 Claims, 2 Drawing Sheets

5,482,875

METHOD FOR FORMING A LINEAR HETEROJUNCTION FIELD EFFECT TRANSISTOR

This is a division of application Ser. No. 07/932,526, filed Aug. 20, 1992, now U.S. Pat. No. 5,304,825.

BACKGROUND OF THE INVENTION

This invention relates, in general, to transistors and, more particularly, to field effect transistors.

Radio frequency (RF) and microwave field effect transistors serve as low noise, linear radio frequency amplifiers in multi-channel receivers and transmitters. Although these transistors provide adequate gain and noise figure characteristics, they introduce intermodulation distortion for low drain current applications. Intermodulation distortion is caused by the non-linearities in the field effect transistors and degrades the quality of the amplified signal.

Several techniques are employed to reduce intermodulation distortion including a push-pull amplifier configuration, feedback, control of termination impedances at the second harmonic of the signal, and optimization of channel doping profiles. Most techniques for reducing intermodulation distortion require external circuitry or termination schemes, thereby increasing the cost and complexity of the multi-channel receivers and transmitters. Moreover, the processing changes for optimizing channel doping profiles are difficult to control.

Accordingly, it would be advantageous to have a low-cost technique for controlling intermodulation distortion that is readily incorporated into standard manufacturing techniques and can be integrated into the field effect transistor without requiring external circuitry.

SUMMARY OF THE INVENTION

Briefly stated, the present invention is a field effect transistor (FET) having a source region, a drain region, a gate region, and a channel restriction means. The source and drain regions include a source electrode and a drain electrode, respectively, which are ohmically coupled to a channel layer. The gate region includes a gate electrode electrically separated from the channel layer by a Schottky barrier. The channel restriction means cooperates with the channel layer to limit or restrict a flow of drain current. The channel restriction means is adjacent to and on the drain region side of the gate region.

DETAILED DESCRIPTION OF THE DRAWINGS

Figure 1:
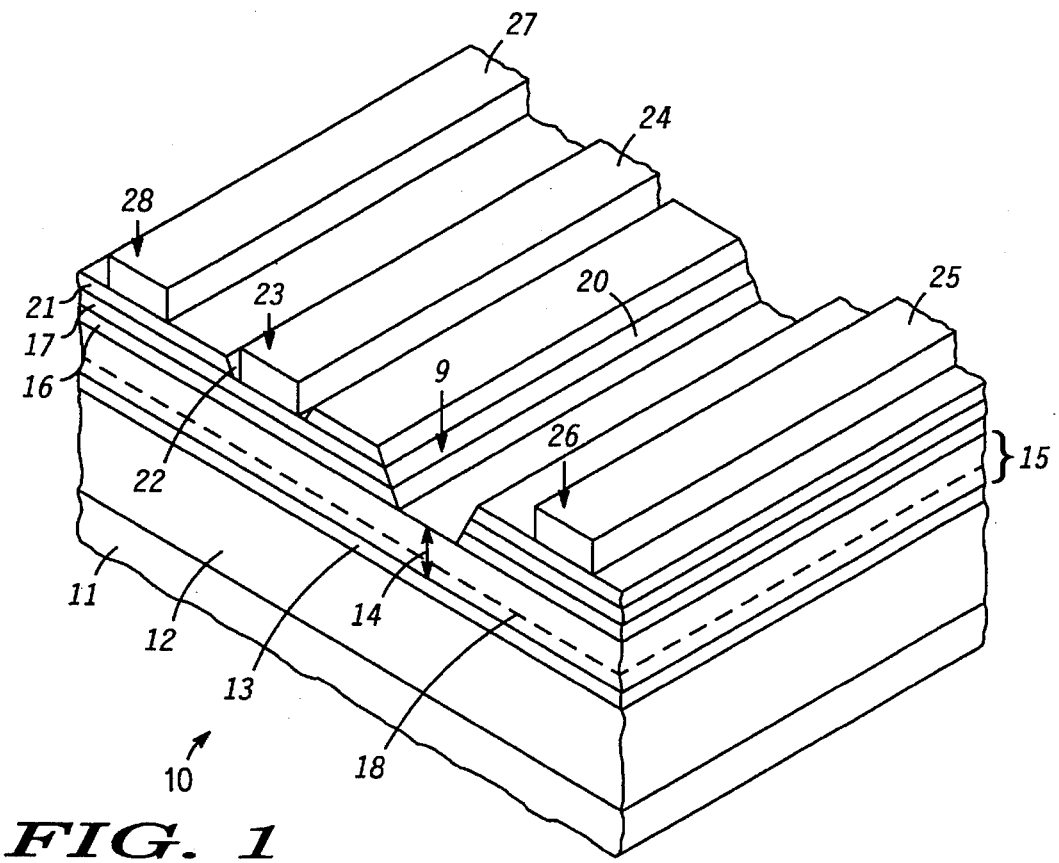
FIG. 1 illustrates a highly enlarged cross-sectional perspective view of a first embodiment of a field effect transistor in accordance with the present invention.

Field effect transistors (FETs) are devices which can serve as radio frequency (RF) and microwave amplifiers in multi-channel receivers and transmitters. Two important parameters guiding designers in selecting a FET as an amplifier are its nonlinear distortion characteristics and power dissipation. The nonlinear distortion characteristics in an output signal of a FET used as an amplifier are described by nonlinear distortion terms in the drain current equation. The most important distortion terms for linearity are those having an odd power dependence on the gate-source voltage. In particular, nonlinear distortion terms dependent on the third power of the gate-source voltage (i.e. third order terms) introduce the largest nonlinearities in the FET output signal because these terms create some frequencies in the output that are the same as those of the input, and other frequencies that are very close to those of the input.

A figure of merit commonly used to characterize the nonlinear distortion as a function of output power levels is a third order intercept point. To derive this figure of merit for a FET, a curve for the fundamental output power terms versus input power and a curve for the third order output power terms versus input power is generated. Each curve is extended in a linear fashion until they intersect, giving rise to the third order intercept point (IP3). The larger the IP3 point the lower the intermodulation distortion and the better the linearity of the FET.

Pucel, in U.S. Pat. No. 4,163,984 which is herein incorporated by reference, describes the drain current by a Taylor series expansion wherein the term having a third power dependence on the gate-source voltage is the second derivative of the transconductance, $g_m$, with respect to the gate-source voltage. In accordance with the present invention, intermodulation distortion may be lowered by selecting the drain current such that the second derivative of $g_m$ with respect to the gate-source voltage is approximately zero. At this drain current, the first derivative of $g_m$ with respect to the gate-source voltage is at, approximately, a relative maximum.

In addition, the drain current at which the lowest intermodulation distortion occurs can be controlled to reduce the dissipated power. There are two drain current values, commonly referred to as operating points, at which the second derivative of $g_m$ with respect to the gate-source voltage is approximately zero; a lower and a higher drain current operating point. The lower drain current operating point occurs at a drain current having a value between the value of the drain current at which the $g_m$ of the FET is at a maximum and the channel of the FET becomes pinched off. The higher drain current operating point occurs at a drain current having a value between the value of the drain current at which the $g_m$ of the FET is at a maximum and the saturation current of the FET. The preferable operating point for the drain current is the lower value, thereby lowering power dissipation. In accordance with the present invention, the preferred operating point can be controlled by a channel restriction means.

A linearity Figure-of-Merit is defined as the ratio of the IP3 point to the dc power dissipation of the FET. This Figure-of-Merit provides an indication of the relative non-linear distortion and the power dissipation between several FETs. A larger value of the linearity Figure-of-Merit indicates a more desirable level of nonlinear distortion and dc power dissipation. The linearity Figure-of-Merit may be increased by increasing the IP3 point, decreasing the dc power dissipation, or a combination of both. The present invention teaches increasing the IP3 point by selecting the drain current such that the second derivative of $g_m$ with respect to the gate-source voltage is approximately zero, and selecting the drain current for a lower dc power dissipation. In addition, the present invention teaches that the value of the drain current at which the second derivative of gm with respect to the gate-source voltage is zero can be adjusted by the addition of a channel restriction means to the FET. The channel restriction means shifts the drain current at which a minimum intermodulation distortion occurs to a lower value.

FIGS. 1–4 illustrate highly simplified views of four embodiments of a heterojunction field effect transistor (HFET) structure in accordance with the present invention. Although illustrative of the modified channel region of the present invention, the device structures shown in FIGS. 1–4 do not include many structures and features which may be present in a practical HFET device. These modifications and additions to the structures shown in FIGS. 1–4 which would yield a practical and manufacturable HFET device are well known in the semiconductor art and are intended to be encompassed within the scope of the present invention. Although the invention is described for specific HFET embodiments, the method is directly applicable to other HFETs, as well as to metal semiconductor FETs (MESFETs) and other transistor structures. Further, the semiconductor layers used in the structure of the present invention can be formed using conventional epitaxial deposition techniques such as metal oxide chemical vapor deposition (MOCVD) or molecular beam epitaxy (MBE).

FIG. 1 illustrates a highly enlarged cross-sectional perspective view of a portion of a first embodiment of the present invention including a drain current restriction region 9. The HFET 10 of FIG. 1 is formed on a semi-insulating semiconductor substrate 11 on which is formed a semiconductor buffer layer 12. Buffer layer 12 is non-intentionally doped and usually comprises a material such as gallium arsenide (GaAs) or a superlattice comprising GaAs and AlAs. A thickness of buffer layer 12 may be, for example, approximately 200 nanometers (nm). A semiconductor channel layer 13, comprising indium gallium arsenide (InGaAs) or GaAs, is formed covering buffer layer 12. Preferably, channel layer 13 is $In_{0.15}Ga_{0.85}As$ having a thickness of approximately 13 nm. Channel layer 13 is covered by a semiconductor barrier layer 15 comprising aluminum gallium arsenide (AlGaAs), and more specifically, $Al_{0.3}Ga_{0.7}As$ having a thickness of approximately 25 nm. Typically, barrier layer 15 includes a doped portion 18 wherein the dopant is silicon. Doped portion 18 may be a planar doped portion 18 or a pulsed doped portion 18. Typically, doped portion 18 has a thickness of less than approximately ten atomic layers. Planar doping and pulsed doping are well known to those skilled in the art.

In the first embodiment, doped portion 18 is preferably a planar doped portion 18, approximately 4 nm away from channel layer 13 and having a concentration of approximately $5 \times 10^{12}$ $cm^{-2}$. A semiconductor spacer layer 16 is formed over barrier layer 15. Preferably, spacer layer 16 is GaAs. A semiconductor Schottky layer 17 of, for example, AlGaAs is formed over spacer layer 16. Preferably, the AlGaAs of Schottky layer 17 is $Al_{0.3}Ga_{0.7}As$ having a thickness of approximately 3 nm. Schottky layer 17 is covered by a semiconductor ohmic contact layer 21, wherein ohmic contact layer 21 is preferably GaAs having a thickness of approximately 50 nm. In one embodiment, channel layer 13, barrier layer 15, spacer layer 16, Schottky layer 17, and ohmic contact layer 21 are doped to have N conductivity type.

A photoresist mask (not shown) is formed over ohmic contact layer 21, wherein the photoresist mask is patterned to expose portions of ohmic contact layer 21 in drain and source regions 26 and 28, respectively. A drain electrode 25 is formed on the exposed portion of ohmic contact layer 21 in drain region 26. A source electrode 27 is formed on the exposed portion of ohmic contact layer 21 in source region 28. Source electrode 27 is laterally spaced from drain electrode 25. A gate region 23 is between drain and source regions 26 and 28, respectively. Further, drain current restriction region 9 is between gate and drain regions 23 and 26, respectively. The photoresist mask is removed. This photoresist mask may be removed using a phenol-based stripper or other resist stripping techniques known by those skilled in the art.

A photoresist mask (not shown) is patterned over ohmic contact layer 21, wherein the photoresist mask exposes gate region 23 of ohmic contact layer 21. A gate electrode contact cavity 22 is formed in gate region 23. Cavity 22 may be formed in ohmic contact layer 21 by etching ohmic contact layer 21 with a GaAs selective etchant such as, for example, an etching solution comprising ammonium hydroxide, peroxide, and water. Schottky layer 17 serves as an etch-stop which terminates the etching of GaAs ohmic contact layer 21. Cavity 22 exposes a portion of Schottky layer 17. The type of etchant is not a limitation to the present invention. In other words any GaAs selective etchant may be employed.

A gate electrode 24, formed in cavity 22, contacts the exposed portion of Schottky layer 17 and forms a Schottky barrier with Schottky layer 17. The Schottky barrier serves to electrically separate gate electrode 24 from channel layer 13. The photoresist mask is removed in a manner as described previously.

A photoresist mask (not shown) is formed over HFET 10, wherein the photoresist mask is patterned to expose a portion of ohmic contact layer 21 in current restriction region 9. Ohmic contact layer 21 is etched with a GaAs selective etchant such as, for example, the etching solution comprising ammonium hydroxide, peroxide, and water. Thus, the etch exposes a portion of Schottky layer 17 which serves as an etch-stop, terminating the etching of GaAs ohmic contact layer 21. The exposed portion of Schottky layer 17 is etched with an AlGaAs selective etchant such as, for example, a 10% hydrofluoric acid solution. Since the hydrofluoric acid solution is selective for AlGaAs, the etch stops at GaAs spacer layer 16, thereby exposing a portion of GaAs spacer layer 16. GaAs spacer layer 16 serves as another etch-stop. The exposed portion of GaAs spacer layer 16 is etched with a GaAs selective etchant such as, for example, the etching solution comprising ammonium hydroxide, peroxide, and water. Since the etching solution comprising ammonium hydroxide, peroxide, and water is selective for GaAs, the AlGaAs barrier layer 15 serves as yet another etch-stop layer. Thus, a current restriction cavity 20 is formed by the series of etches, wherein cavity 20 exposes a portion of barrier layer 15. Cavity 22 is adjacent to cavity 20. The type of etchant is not a limitation to the present invention. In other words, any GaAs or AlGaAs selective etchant may be employed. The photoresist mask is removed in a manner as described previously.

Drain current restriction cavity 20 is formed in drain current restriction region 9 wherein cavity 20 serves as a channel restriction means. Cavity 20 extends from a major surface of ohmic contact layer 21, through ohmic contact layer 21, through Schottky layer 17, through spacer layer 16, stopping at and exposing a portion of barrier layer 15.

The thickness (shown by arrows 14) of barrier layer 15 between cavity 20 and channel layer 13 determines the carrier concentration of channel layer 13. The drain saturation current is proportional to the thickness 14. Thus, the drain saturation current may be controlled by a selection of the thickness 14. In other words, the current flowing in a channel formed in channel layer 13 is constricted in a controllable fashion by thickness 14, thereby permitting tailoring of the heterojunction field effect transistor output characteristics such as the drain saturation current. In the first embodiment, the thickness of barrier layer 15, and thus thickness 14, is selected to provide a drain operating current ranging between, approximately, 0.5 and 1 milliamps.

Including cavity 20 compresses the drain current-gate-source voltage output response, thereby moving the point at which the second derivative of $g_m$ with respect to the gate-source voltage is approximately zero to a lower operating current. Further, a depth of cavity 20, determines thickness 14 which sets the drain saturation current. It shall be understood that control of the output response characteristics of HFET 10 is achieved by positioning the drain current restriction region 9 between gate and drain electrodes 24 and 25, respectively.

Figure 2:
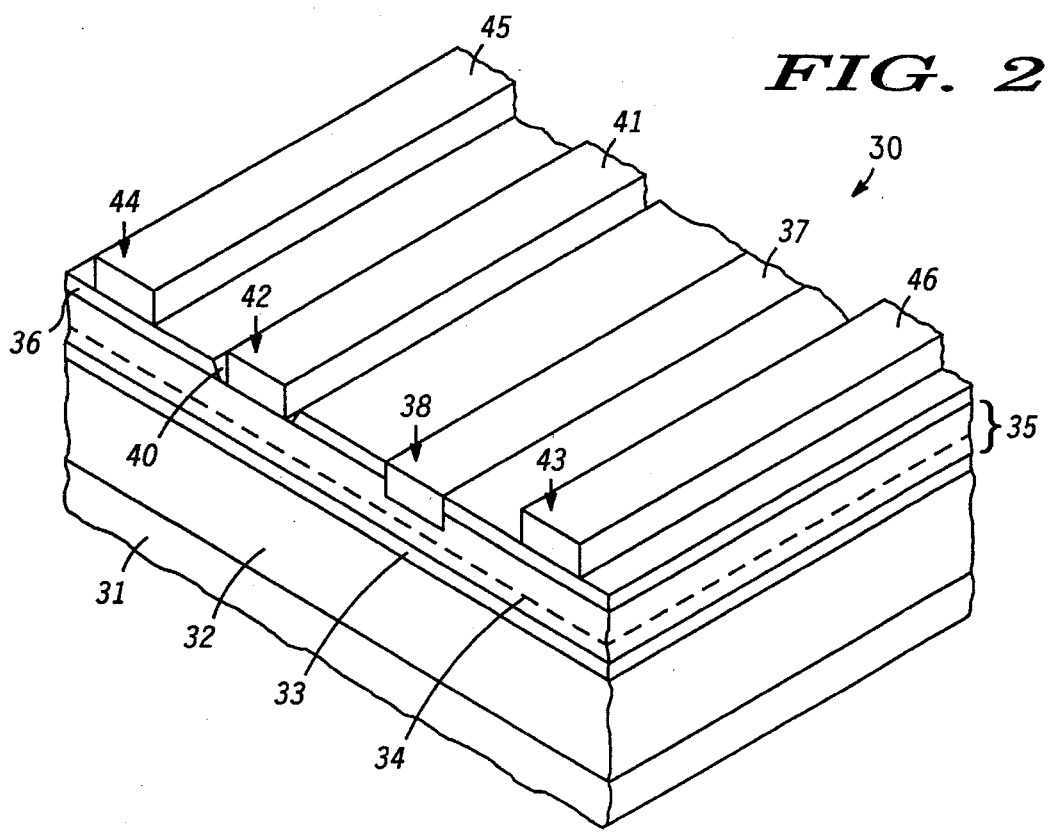
FIG. 2 illustrates a highly enlarged cross-sectional perspective view of a second embodiment of a field effect transistor in accordance with the present invention.

FIG. 2 illustrates a highly enlarged cross-sectional perspective view of a portion of a second embodiment of the present invention including a drain current restriction region 38. The HFET 30 of FIG. 2 is formed on a semi-insulating semiconductor substrate 31 on which is formed a semiconductor buffer layer 32 wherein buffer layer 32 is non-intentionally doped. Buffer layer 32 usually comprises a semiconductor material such as gallium arsenide (GaAs) or a superlattice comprising GaAs and AlAs. Preferably buffer layer 32 has a thickness of approximately 200 nm. A semiconductor channel layer 33, comprising indium gallium arsenide (InGaAs) or GaAs, is formed covering buffer layer 32. Preferably, channel layer 33 comprises $In_{0.15}Ga_{0.85}As$ having a thickness of approximately 13 nm. Although GaAs has been used widely in the industry, InGaAs channel layers have been found to provide superior device performance. Channel layer 33 is covered by a semiconductor barrier layer 35 comprising aluminum gallium arsenide (AlGaAs), and more specifically, $Al_{0.3}Ga_{0.7}As$ having a thickness of approximately 37 nm. Typically, barrier layer 35 includes a doped portion 34 wherein the dopant is, preferably, silicon. Doped portion 34 may be a planar doped portion 34 or a pulsed doped portion 34. Typically, doped portion 34 has a thickness of less than ten atomic layers. Planar doping and pulsed doping are well known to those skilled in the art.

In the second embodiment, doped portion 34 is preferably a planar doped portion 34, approximately 4 nm away from channel layer 33 having a concentration of approximately $5\times10^{12}$ cm$^{-2}$. A semiconductor ohmic contact layer 36 is formed on barrier layer 35. Preferably ohmic contact layer 36 is GaAs having a thickness of approximately 50 nm. In one embodiment, channel layer 33, barrier layer 35, and ohmic contact layer 36 are doped to have N conductivity type.

A photoresist mask (not shown) is formed over ohmic contact layer 36 wherein the photoresist mask is patterned to expose a portion of ohmic contact layer 36 in drain current restriction region 38. A doped drain current restriction region 37 is formed in drain current restriction region 38 from a P type impurity material, wherein doped region 37 serves as a channel restriction means. Doped region 37 extends from a major surface of ohmic contact layer 36, through ohmic contact layer 36, and into barrier layer 35. Doped region 37 may be formed by providing an opening in a photoresist mask and diffusing or ion implanting the P type impurity material through a portion of ohmic contact layer 36 and into barrier layer 35. In one embodiment, a depth of doped region 37 is approximately 60 nm wherein doped region 37 has a surface concentration of approximately $2\times10^{18}$ cm$^{-3}$. Methods for introducing impurity materials into a semiconductor material are well known to those skilled in the art. The photoresist mask is removed in a manner as described previously.

A photoresist mask (not shown) is formed over ohmic contact layer 36 and is patterned to expose a portion of ohmic contact layer 36 in drain and source regions 43 and 44, respectively. A drain electrode 46 is formed on the exposed portion of ohmic contact layer 36 in drain region 43. Drain electrode 46 is laterally spaced from doped region 37. A source electrode 45 is formed on the exposed portion of ohmic contact layer 36 in source region 44 such that source electrode 45 is laterally spaced from doped region 37, wherein doped region 37 is between drain and source electrodes 46 and 45, respectively. The photoresist mask is removed in a manner as described previously.

A photoresist mask (not shown) is formed over ohmic contact layer 36, wherein the photoresist mask is patterned to expose a portion of ohmic contact layer 36 in gate region 42. A gate electrode cavity 40 is formed in gate region 42. Cavity 40 may be formed by etching ohmic contact layer 36 with a GaAs selective etchant such as, for example, an etching solution comprising ammonium hydroxide, peroxide, and water. Barrier layer 35 serves as an etch-stop which terminates the etching of GaAs ohmic contact layer 36. The type of etchant is not a limitation to the present invention. In other words any GaAs selective etchant may be employed. Cavity 40 is adjacent to doped region 37 and extends from a major surface of ohmic contact layer 36 to barrier layer 35, exposing a portion of barrier layer 35. A gate electrode 41, formed in cavity 40, contacts the exposed portion of barrier layer 35 and forms a Schottky barrier with barrier layer 35. The Schottky barrier electrically separates gate electrode 41 from channel layer 33. The photoresist mask is removed in a manner as described previously.

Gate electrode 41 is laterally spaced from and between source electrode 45 and drain electrode 46. In other words, gate region 42 is between drain and source regions 43 and 44, respectively. Further, doped region 37 is between gate and drain regions 42 and 43, respectively. Thus, doped region 37 is on the drain electrode 46 side of gate electrode 41. Because of the high doping in the drain and source regions of ohmic contact layer 36, drain and source electrodes 46 and 45, respectively, are ohmically coupled to channel layer 33.

Doped region 37 creates a depletion region into a portion of channel layer 33 between doped region 37 and buffer layer 32; thereby decreasing the drain current which flows through channel layer 33 in response to a gate-source voltage signal. In addition, the drain saturation current is decreased. The drain saturation current may be set to a desired value by selecting the depth and the doping concentration of doping region 37; thus, doped drain current restriction region 37 cooperates with channel layer 33 to limit or restrict the flow of drain current. For example, to achieve a operating current ranging between approximately 0.5 and 1 milliamp, the depth of doped region 37 is approximately 60 nm and the surface concentration of doped region 37 is approximately $2\times10^{18}$ cm$^{-3}$.

Including doped region 37 compresses the drain current-gate-source voltage output response curve, allowing a lower operating current and selection of the drain current operating point wherein the second derivative of $g_m$ with respect to the gate-source voltage is approximately zero. It shall be understood that in addition to the depth and doping concentration of doping region 37, control of the output response characteristics of HFET 30 is achieved by positioning drain current restriction region 38 between gate and drain regions 42 and 43, respectively.

Figure 3:
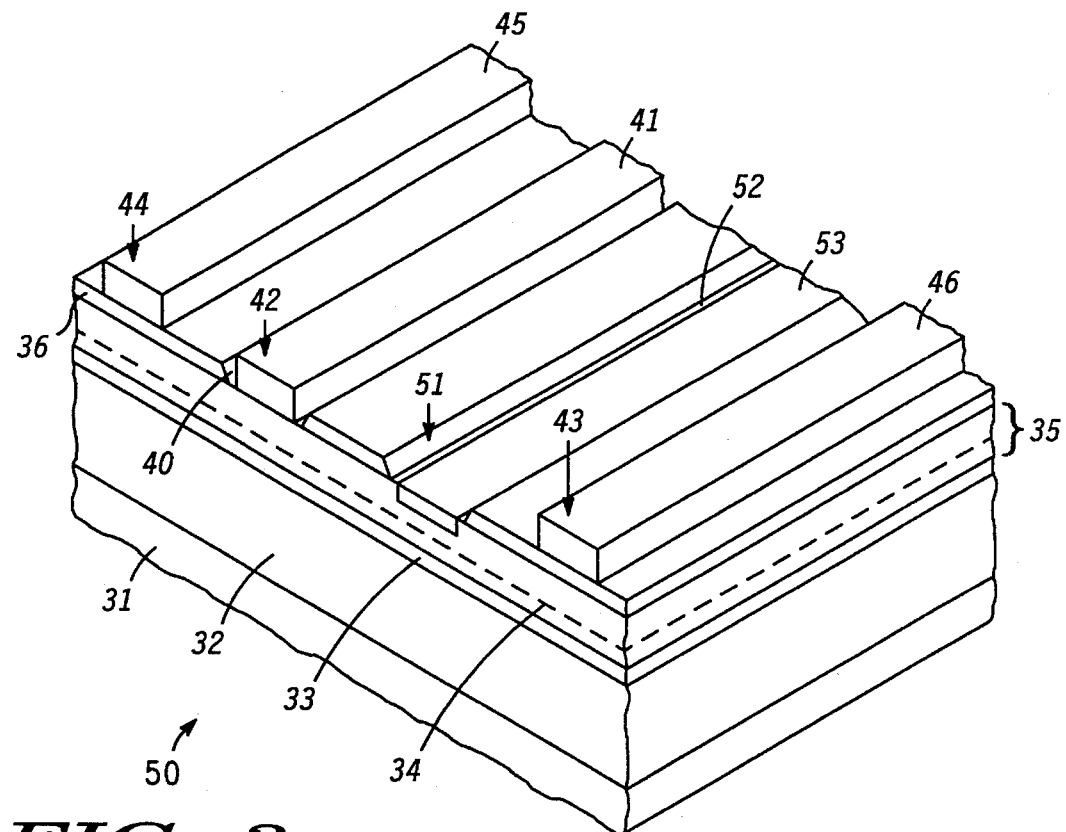
FIG. 3 illustrates a highly enlarged cross-sectional perspective view of a third embodiment of a field effect transistor in accordance with the present invention.

FIG. 3 illustrates a highly enlarged cross-sectional perspective view of a third embodiment of an HFET 50 having a drain current restriction region 51 in accordance with the present invention. In this embodiment, the processing steps for the formation of HFET 50 are identical to those for forming HFET 30, with the addition of an etch step. Accordingly, the detailed description of the embodiment of FIG. 3 incorporates the processing steps and reference numerals used in the detailed description of the embodiment disclosed in FIG. 2 with the following exceptions: the HFET of FIG. 3 is referred to as HFET 50, the current restriction region is referred to as current restriction region 51, and the doped region is referred to as doped region 53.

The processing steps for formation of drain current restriction region 51 are identical to those described in FIG. 2 up to the formation of the doped region of current restriction region 38 of FIG. 2. A current restriction cavity 52 is formed in current restriction region 51. Thus, current restriction region 51 comprises doped region 53 which cooperates with current restriction cavity 52. However, in FIG. 3, the doped region of current restriction region 51 typically has a different doping depth and doping concentration, and is referred to as doped region 53. Preferably, the dopant extends approximately 10 nm into barrier layer 35, and has concentration of approximately $1 \times 10^{17}$ cm$^{-3}$.

Doped region 53 and cavity 52 are positioned between gate and drain regions 42 and 43, respectively. Cavity 52 may be formed by etching ohmic contact layer 36 with a GaAs selective etchant such as, for example, an etching solution comprising ammonium hydroxide, peroxide, and water. Barrier layer 35 serves as an etch-stop which terminates the etching of GaAs ohmic contact layer 36. Cavity 52 extends from a major surface of ohmic contact layer 36 to barrier layer 35, exposing a portion of barrier layer 35.

Formation of gate, drain, and source electrodes, 41, 46, and 45 is as disclosed in the description of FIG. 2. It shall be understood that the order of steps in the formation of current restriction region 51 is not a limitation of the present invention. In other words, current restriction cavity 52 may be formed prior to formation of doped region 53.

Cavity 52 cooperates with doped region 53 to create a depletion region into a portion of channel layer 33 between doped region 53 and buffer layer 32; thereby decreasing the drain current which flows through channel layer 33 in response to a gate-source voltage signal. In addition, the drain saturation current is decreased. The drain saturation current may be set to a desired value by selecting the depth and the doping concentration of doping region 53, as well as the depth of cavity 52. For example, an operating current ranging between approximately 0.5 and 1 milliamp is achieved when cavity 52 stops at barrier layer 35, and doping region 53 extends approximately 10 nm into barrier layer 35, and has a concentration of, approximately, $1 \times 10^{17}$ cm$^{-3}$. Since cavity 52 cooperates with doped region 53, the parameters of depth and concentration of doped region 53 are less than those of doped region 37 of FIG. 2. Although the third embodiment has been described in conjunction with the second embodiment disclosed in FIG. 2, it shall be understood that the third embodiment may be realized using the structure of FIG. 1. When using the structure of FIG. 1 it should be realized that formation of the current restriction region should occur before formation of gate, drain, and source electrodes, to preclude dopant diffusion during high temperature annealing steps that may be included when forming a doped region.

Figure 4:
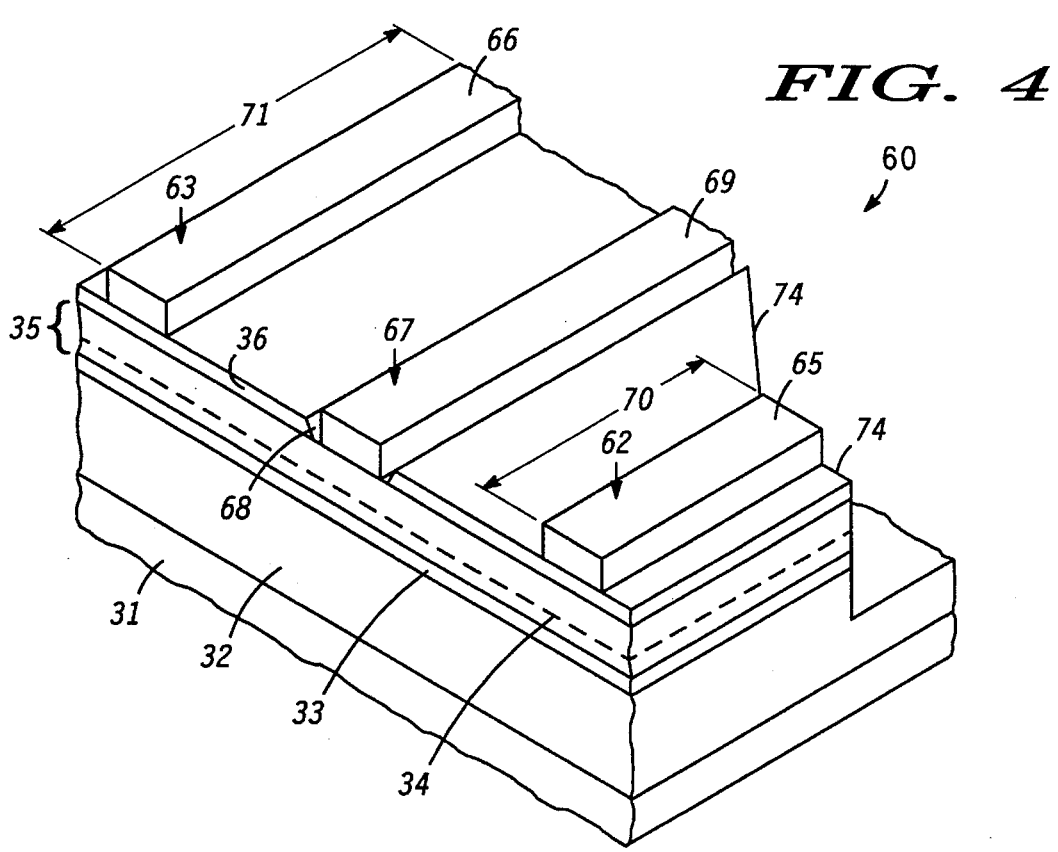
FIG. 4 illustrates a highly enlarged cross-sectional perspective view of a fourth embodiment of a field effect transistor in accordance with the present invention.

FIG. 4 illustrates a highly enlarged cross-sectional perspective view of a fourth embodiment of an HFET 60 in accordance with the present invention. In the fourth embodiment, the drain current-gate-source output response characteristics are controlled by decreasing the width of the channel, rather than a height of the channel as taught in the first, second, and third embodiments. Accordingly, the semiconductor structure of the second embodiment may serve as a portion of the semiconductor structure for the fourth embodiment. In other words, the processing steps for the fourth embodiment are the same as the processing steps of the second embodiment up to the step of forming ohmic contact layer 36.

A photoresist mask (not shown) is formed over ohmic contact layer 36 wherein the photoresist mask is patterned to expose a portion of ohmic contact layer 36 in drain and gate regions 62 and 67, respectively. The photoresist mask defines an isolation region as well as a width of a drain electrode 65, as subsequently discussed. A boundary of the isolation region is denoted by line 74. The exposed portion of ohmic contact layer 36, barrier layer 35, channel layer 33, and a portion of buffer layer 32 are etched with a GaAs etchant such as, for example, an etching solution comprising hydrochloric acid, peroxide, and water. The etching of buffer layer 32 is timed such that the etch etches through, approximately, 100 nm of buffer layer 32. The photoresist mask is removed in a manner as described previously.

A photoresist mask (not shown) is formed over ohmic contact layer 36, wherein the photoresist mask is patterned to expose a portion of ohmic contact layer 36 in drain and source regions 62 and 63, respectively. A drain electrode 65 is formed on the exposed portion of ohmic contact layer 36 in drain region 62. The width of drain electrode 65 is limited by the isolation region. A source electrode 66 is formed on the exposed portion of ohmic contact layer 36 in source region 63 such that source electrode 66 is laterally spaced from drain electrode 65. It shall be understood that formation of drain and source electrodes 65 and 66 occurs in the same processing step. Drain electrode 65 has a narrower width than source electrode 66. The width of drain electrode 65 is denoted by arrows 70 and the width of source electrode 66 is denoted by arrows 71. Thus, drain electrode 65 has a smaller area or size than source electrode 66.

Drain electrode 65 defines an active area of drain region 62 and source electrode 66 defines an active area of source region 63. The distance between drain electrode 65 and gate electrode 69 as well as the width of the drain electrode define a current confinement region. Drain and source electrodes 65 and 66, respectively, form an ohmic contact with ohmic contact layer 36. The photoresist mask is removed in a manner as described previously.

A ratio of the width of the source contact to the width of the drain contact in the range of approximately 5 to 10 and a distance between nearest sides of drain and gate electrodes 65 and 69, respectively, ranging between, approximately, 10 μm to 20 μm, yields a drain operating current in a range of approximately 0.5 to 1 milliamp. For example, a drain operating current of approximately 0.5 milliamp is achieved by fabricating a source contact having a width 71 of approximately 100 μm and a drain contact having a width 70 of approximately 12.5 μm.

A photoresist mask (not shown) is formed over ohmic contact layer 36 and drain and source electrodes 65 and 66, respectively, wherein the photoresist mask is patterned to expose a portion of ohmic contact layer 36 in gate region 67. A gate electrode cavity 68 is formed in gate region 67. Gate electrode cavity 68 is laterally spaced from drain electrode 65 and source electrode 66, and positioned between electrodes 65 and 66. Cavity 68 may be formed by etching ohmic contact layer 36 with a GaAs selective etchant such as, for example, an etching solution comprising ammonium hydroxide, peroxide, and water. Barrier layer 35 serves as an etch-stop which terminates the etching of GaAs ohmic contact layer 36. The type of etchant is not a limitation to the present invention. In other words any GaAs selective etchant may be employed.

A gate electrode 69, formed in cavity 68, contacts the exposed portion of barrier layer 35 and forms a Schottky barrier with barrier layer 35. The Schottky barrier electrically separates gate electrode 69 from channel layer 33. The photoresist mask is removed in a manner as described previously.

Thus, in the fourth embodiment the channel width is restricted by making the sizes of the active areas of drain region 62 smaller than those of source region 63. Further, the drain and source sizes are selected such that a desired HFET output response is attained. In this embodiment the size of the active drain area relative to the active source area serves as a channel restriction means. Because of the high doping in the drain and source regions 62 and 63, respectively, of ohmic contact layer 36, electrodes 65 and 66 are ohmically coupled to channel layer 33.

In yet a fifth embodiment (not shown), an electrical means is taught for lowering the power dissipation and setting the operating point such that the second derivative of $g_m$ with respect to the gate-source voltage is approximately zero. In this embodiment, a basic HFET structure as described in FIG. 2 is provided wherein the HFET structure lacks doped region 37 of FIG. 2. A second gate electrode contacts a different portion of a barrier layer than a first gate electrode thereby forming a dual gate HFET. The first and second gate electrodes are spaced and in parallel over a channel layer. The second gate electrode of a dual gate HFET is biased to set the drain saturation current of the transistor and to restrict the drain current. The first gate electrode is used for modulation of the signal. Thus, the second gate electrode serves as a channel restriction means. Accordingly, in the fifth embodiment the bias on the second gate electrode of the dual gate HFET serves as a channel restriction means.

Although described in terms of an N-channel FET formed using gallium arsenide base compounds, it should be understood that the structures of the embodiments of FIGS. 1–4 could be formed as a P channel FET using the method of the present invention. Further, materials other than gallium arsenide, such as silicon, germanium, and indium phosphide could be used to form the heterostructure field effect transistor.

By now it should be appreciated that there has been provided an improved FET capable of operating with a reduced intermodulation distortion and lower power dissipation. The present invention teaches decreasing the drain current by changing the effective size of the channel between the drain and gate electrodes, rather than using the conventional technique of modifying the doping profile of the FET. In the first, second, third, fourth, and fifth embodiments, the partial depletion of the channel limits the maximum current flowing through the channel layer. Increasing the depletion of the carriers essentially constricts the channel. The process steps required for realizing the first, second, third, fourth, and fifth embodiments are readily incorporated into standard FET processing techniques since they only involve etching and doping techniques.

In the fourth embodiment, the width of the channel is decreased, thereby decreasing the size of the drain electrode such that the drain electrode has a smaller area than the source electrode. Since the drain current is directly proportional to the width of the channel, the drain current decreases as the width of the channel decreases. Thus, a judicious narrowing of the channel at the drain electrode, permits lowering the saturation current of the FET which in turn translates to a lower power dissipation. Further, the layout may be optimized for the FET to operate such that the second derivative of $g_m$ with respect to the gate-source voltage is approximately zero. Using the layout to decrease the width of the channel adds no additional processing steps to the manufacture of the FET and is easily included in the fabrication sequence for the FET.

Thus, the present invention teaches a means to lower the intermodulation distortion that is readily incorporated in a FET fabrication sequence. Further, the means lowers the power dissipation of the FET, rendering the present invention ideally suited for use in such applications as portable communications equipment. Another advantage is a cost savings by elimination of the need for additional external circuitry to circumvent the problem of intermodulation distortion.

We claim:

1. A method for setting a drain saturation current in a field effect transistor having an asymmetric channel restriction means adjacent a drain side of the gate electrode and absent from a source side of the gate electrode comprising the steps of:

providing a semi-insulating semiconductor substrate;

forming a buffer layer on the semi-insulating semiconductor substrate, the buffer layer being a non-intentionally doped semiconductor material;

forming a semiconductor channel layer on the buffer layer;

forming a semiconductor barrier layer on the semiconductor channel layer;

forming a semiconductor ohmic contact layer on the semiconductor barrier layer;

providing a semiconductor impurity material in a first portion of the semiconductor ohmic contact layer, the semiconductor impurity material extending from a first major surface of the semiconductor ohmic contact layer into a first portion of the semiconductor barrier layer;

forming a cavity in a gate region of the semiconductor ohmic layer, the cavity spaced from the first portion of the semiconductor ohmic contact layer thereby exposing a portion of a first major surface of the semiconductor barrier layer, the semiconductor impurity material and the cavity serving as the asymmetric channel restriction means and cooperating with the channel layer to limit a flow of drain current;

forming the gate electrode of the field effect transistor on a portion of the first major surface of the semiconductor barrier layer, the gate electrode electrically separated from the semiconductor channel layer by a Schottky barrier;

forming the drain electrode of the field effect transistor in a drain region of the semiconductor ohmic contact layer, the drain electrode ohmically coupled to the semiconductor channel layer and laterally spaced from the semiconductor impurity material wherein the semiconductor impurity material is between the gate electrode and the drain electrode; and forming the source electrode of the field effect transistor in a source region of the ohmic contact layer, the source electrode ohmically coupled to the semiconductor channel layer.

2. A method for setting a drain saturation current in a field effect transistor having an asymmetric channel restriction means adjacent a drain side of the gate electrode and absent from a source side of the gate electrode comprising the steps of:

providing a semi-insulating semiconductor substrate;

forming a buffer layer on the semi-insulating semiconductor substrate, the buffer layer being a non-intentionally doped semiconductor material;

forming a semiconductor channel layer on the buffer layer;

forming a semiconductor barrier layer on the semiconductor channel layer;

forming a semiconductor ohmic contact layer on the semiconductor barrier layer;

providing a semiconductor impurity material in a first portion of the semiconductor ohmic contact layer, the semiconductor impurity material extending from a first major surface of the semiconductor ohmic contact layer into a first portion of the semiconductor barrier layer;

forming a first cavity in the first portion of the semiconductor ohmic contact layer, the first cavity extending from the first major surface of the semiconductor ohmic contact layer;

forming a second cavity in a gate region of the semiconductor ohmic contact layer, the second cavity spaced from the first portion of the semiconductor ohmic contact layer thereby exposing a portion of the first major surface of the semiconductor barrier layer;

forming the gate electrode of the field effect transistor on a portion of the first major surface of the semiconductor barrier layer, the portion of the first major surface in the second cavity and the gate electrode electrically separated from the semiconductor channel layer by a Schottky barrier;

forming the drain electrode of the field effect transistor in a drain region of the semiconductor ohmic contact layer, the drain electrode ohmically coupled to the semiconductor channel layer and laterally spaced from the semiconductor impurity material wherein the semiconductor impurity material is between the gate electrode and the drain electrode; and forming the source electrode of the field effect transistor in a source region of the ohmic contact layer, the source electrode ohmically coupled to the semiconductor channel layer.

3. A method for setting a drain saturation current in a field effect transistor having an asymmetric channel restriction means adjacent a drain side of the gate electrode and absent from a source side of the gate electrode comprising the steps of:

providing a semi-insulating semiconductor substrate;

forming a buffer layer on the semi-insulating semiconductor substrate, the buffer layer being a non-intentionally doped semiconductor material;

forming a channel layer on the buffer layer, the channel layer being a doped semiconductor material;

forming a barrier layer on the channel layer, the barrier layer being a doped semiconductor material wherein the barrier layer serves as a first etch-stop layer;

forming a spacer layer on the barrier layer, the spacer layer being a doped semiconductor material;

forming a second etch-stop layer on the spacer layer, the second etch-stop layer being a doped semiconductor material;

forming an ohmic contact layer on the second etch-stop layer, the ohmic contact layer being a doped semiconductor material;

forming a first cavity, the first cavity extending from a major surface of the ohmic contact layer to the first etch-stop layer;

forming a second cavity, the second cavity extending from the major surface of the ohmic contact layer to the barrier layer;

forming the gate electrode of the field effect transistor in the first cavity, the gate electrode electrically separated from the semiconductor channel layer by a Schottky barrier;

forming the source electrode of the field effect transistor such that the source electrode is laterally spaced from the gate electrode and the source electrode is ohmically coupled to the semiconductor channel layer;

forming the drain electrode of the field effect transistor, the drain electrode positioned such that the second cavity is between the gate and drain electrodes.

4. A method for setting a drain saturation current in a field effect transistor having an asymmetric channel restriction means adjacent a drain side of the gate electrode and absent from a source side of the gate electrode comprising the steps of:

providing a semi-insulating semiconductor substrate;

forming a buffer layer on the semi-insulating semiconductor substrate, the buffer layer being a non-intentionally doped semiconductor material;

forming a semiconductor channel layer on the buffer layer;

forming a semiconductor barrier layer on the semiconductor channel layer;

forming a semiconductor ohmic contact layer on the semiconductor barrier layer;

forming a cavity wherein the cavity exposes a portion of the semiconductor barrier layer;

forming the gate electrode of the field effect transistor in the cavity, wherein the gate electrode contacts the semiconductor barrier layer and is electrically separated from the semiconductor channel layer by a Schottky barrier;

forming a source electrode of the field effect transistor such that the source electrode contacts a portion of the semiconductor ohmic contact layer, the source electrode is laterally spaced from the gate electrode and defines a source area; and forming the drain electrode of the field effect transistor wherein the drain electrode contacts a portion of the semiconductor ohmic contact layer, the drain electrode is laterally spaced from the gate electrode and defines a drain area such that the drain area is smaller than the source area.

5. A method of forming a linear heterojunction field effect transistor having a drain saturation current, comprising the steps of:

providing a semi-insulating semiconductor substrate;

forming a buffer layer on a portion of the semi-insulating semiconductor substrate;

forming a semiconductor channel layer on the semiconductor buffer layer;

forming a semiconductor barrier layer on the semiconductor buffer layer;

forming a semiconductor ohmic contact layer over a portion of the semiconductor barrier layer;

forming means for restricting a flow of drain current, the means for restricting a flow of drain current being formed in at least a first portion of the semiconductor ohmic contact layer;

forming a gate electrode having first and second sides, the first side of the gate electrode adjacent the first portion of the semiconductor ohmic contact layer;

forming a drain electrode in contact with a second portion of the semiconductor ohmic contact layer, wherein the first portion of the semiconductor ohmic contact layer is between the second portion of the semiconductor ohmic contact layer and the first side of the gate electrode; and forming a source electrode in contact with a third portion of the semiconductor ohmic contact layer, the third portion of the semiconductor ohmic contact layer adjacent the second side of the gate electrode.

6. The method of claim 5, wherein the step of forming means for restricting a flow of drain current includes exposing a first portion of the semiconductor barrier layer, the first portion of the semiconductor barrier layer laterally positioned between the first side of the gate electrode and the drain electrode.

7. The method of claim 6, wherein the step of forming means for restricting a flow of drain current further includes doping the first portion of the semiconductor barrier layer.

8. The method of claim 7, further including doping the first portion of the semiconductor barrier layer with an impurity material of P conductivity type.

9. The method of claim 6, further including the steps of:

forming a semiconductor spacer layer on the semiconductor barrier layer;

forming a semiconductor Schottky layer on the semiconductor spacer layer; and wherein the step of forming the gate electrode includes forming the gate electrode in contact with a fourth portion of the semiconductor ohmic contact layer.

10. The method of claim 5, wherein the step of forming means for restricting a flow of drain current includes doping the at least a first portion of the semiconductor ohmic contact layer.

11. The method of claim 5, wherein the step of forming the semiconductor barrier layer includes forming a doped portion having a thickness of less than approximately ten atomic layers.

12. The method of claim 5, wherein the step of forming the gate electrode includes forming the gate electrode in contact with a second portion of the semiconductor barrier layer.

13. The method of claim 5 wherein the step of forming the drain electrode includes forming the drain electrode having a smaller area than an area of the source electrode.

14. The method of claim 13, wherein the step of forming the drain electrode having a smaller area than an area of the source electrode includes forming the area of the drain electrode having a first length and a first width and forming the area of the source electrode having a second length and a second width, wherein the first width is less than the second width.

15. A method of setting a drain current in a field effect transistor, comprising the steps of:

providing a semi-insulating semiconductor substrate having a buffer layer disposed thereon, the buffer layer having a channel layer disposed thereon, and the channel layer having a barrier layer disposed thereon;

forming an ohmic contact layer over the channel layer;

forming a gate electrode in contact with a first portion of the barrier layer;

forming means for restricting a drain current flow, the means for restricting a drain current flow adjacent a first side of gate electrode and wherein the means for restricting a drain current flow sets the drain current;

forming a drain electrode in contact with a first portion of the ohmic contact layer, wherein the first portion of the ohmic contact layer is adjacent the means for restricting a drain current flow, and wherein the means for restricting a drain current flow is between a first side of the gate electrode and the first portion of the ohmic contact layer; and forming a source electrode in contact with a second portion of the ohmic contact layer, wherein the second portion of the ohmic contact layer is adjacent a second side of the gate electrode.

16. The method of claim 15, wherein the step of forming a gate electrode comprises exposing the first portion of the barrier layer and forming a Schottky barrier contact to the exposed first portion of the barrier layer and the step of forming means for restricting a drain current flow comprises exposing a second portion of the barrier layer, the second portion of the barrier layer between the first portion of the barrier layer and the first portion of the ohmic contact layer.

17. The method of claim 16, wherein the step of forming means for restricting a drain current flow further includes doping the second portion of the barrier layer.

18. The method of claim 15, wherein the step of forming means for restricting a drain current flow includes doping a third portion of the ohmic contact layer, the third portion of the ohmic contact layer between and laterally spaced apart from the gate electrode and the first portion of the ohmic contact layer.

19. The method of claim 15, further including:

forming the buffer layer from a semiconductor material selected from the group gallium arsenide and a superlattice comprising gallium arsenide and aluminum arsenide;

forming the channel layer from a semiconductor material on N conductivity type and selected from the group indium gallium arsenide and gallium arsenide;

forming the barrier layer from aluminum gallium arsenide doped with an impurity material of N conductivity type;

forming the ohmic contact layer from gallium arsenide doped with an impurity material of N conductivity type; and forming the means for restricting a drain current flow by doping a second portion of the barrier layer with an impurity material of P conductivity type, the second portion of the barrier layer between the first portion of the barrier layer and the first portion of the ohmic contact layer.

* * * * *